United States Patent
Koka et al.

(10) Patent No.: US 9,236,396 B1
(45) Date of Patent: Jan. 12, 2016

(54) THREE DIMENSIONAL NAND DEVICE AND METHOD OF MAKING THEREOF

(71) Applicant: SanDisk Technologies, Inc., Plano, TX (US)

(72) Inventors: Sateesh Koka, Milpitas, CA (US); Senaka Kanakamedala, Milpitas, CA (US); Yanli Zhang, San Jose, CA (US); Raghuveer S. Makala, Campbell, CA (US); Rahul Sharangpani, Fremont, CA (US); George Matamis, Danville, CA (US); Wei Zhao, Milpitas, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/539,307

(22) Filed: Nov. 12, 2014

(51) Int. Cl.
*H01L 29/788* (2006.01)
*H01L 27/115* (2006.01)
(Continued)

(52) U.S. Cl.
CPC ...... *H01L 27/11582* (2013.01); *H01L 21/0217* (2013.01); *H01L 21/02164* (2013.01); *H01L 21/02238* (2013.01); *H01L 21/02532* (2013.01); *H01L 21/02592* (2013.01); *H01L 21/02595* (2013.01); *H01L 21/28273* (2013.01);
(Continued)

(58) Field of Classification Search
CPC .............. H01L 27/11582; H01L 27/11556; H01L 2924/00; H01L 29/7926; H01L 27/1157; H01L 29/6682; H01L 27/1152; H01L 29/66833; H01L 29/7889; H01L 27/0688; H01L 21/28273; H01L 27/11551; H01L 27/11578; H01L 27/115

USPC .................................. 257/316; 438/588, 267
See application file for complete search history.

(56) References Cited

U.S. PATENT DOCUMENTS

| | | |
|---|---|---|
| 5,084,417 A | 1/1992 | Joshi et al. |
| 5,807,788 A | 9/1998 | Brodsky et al. |

(Continued)

FOREIGN PATENT DOCUMENTS

WO    WO2002/015277 A2    2/2002

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Jessica Stultz
*Assistant Examiner* — Vu A Vu
(74) *Attorney, Agent, or Firm* — The Marbury Law Group PLLC

(57) ABSTRACT

A monolithic three dimensional NAND string includes a semiconductor channel, at least one end part of the semiconductor channel extending substantially perpendicular to a major surface of a substrate and a plurality of control gate electrodes extending substantially parallel to the major surface of the substrate. The NAND string also includes a memory film located between the semiconductor channel and the plurality of control gate electrodes and a blocking dielectric containing a plurality of clam-shaped portions each having two horizontal portions connected by a vertical portion. The NAND string also includes a plurality of discrete cover silicon oxide segments located between the memory film and each respective clam-shaped portion of the blocking dielectric containing a respective control gate electrode. Each of the plurality of cover silicon oxide segments has curved upper and lower sides and substantially straight vertical sidewalls.

11 Claims, 12 Drawing Sheets

(51) Int. Cl.
*H01L 21/28* (2006.01)
*H01L 21/02* (2006.01)
*H01L 29/51* (2006.01)
*H01L 29/49* (2006.01)

(52) U.S. Cl.
CPC .... *H01L21/28282* (2013.01); *H01L 27/11556* (2013.01); *H01L 29/495* (2013.01); *H01L 29/517* (2013.01); *H01L 29/7883* (2013.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,799,670 | B2 | 9/2010 | Ramkumar et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,569,827 | B2 | 10/2013 | Lee et al. |
| 2007/0210338 | A1 | 9/2007 | Orlowski |
| 2007/0252201 | A1 | 11/2007 | Kito et al. |
| 2008/0169567 | A1* | 7/2008 | Kai et al. ............... 257/773 |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001252 | A1* | 1/2012 | Alsmeier et al. ............ 257/321 |
| 2012/0068247 | A1* | 3/2012 | Lee et al. ............... 257/316 |
| 2012/0153372 | A1* | 6/2012 | Kim et al. .............. 257/314 |
| 2012/0256247 | A1 | 10/2012 | Alsmeier |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0225181 | A1 | 8/2014 | Makala et al. |
| 2015/0008505 | A1 | 1/2015 | Chien et al. |
| 2015/0076584 | A1 | 3/2015 | Pachamuthu et al. |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Trowbridge et al., "Enhanced Oxidation of Silicon Nitride Using in Situ Steam Generation," 199th ECS Conf. vol. 2000. 2001.

U.S. Appl. No. 14/133,979, filed Dec. 19, 2013, SanDisk Technologies Inc.

U.S. Appl. No. 14/539,372, filed Nov. 12, 2014, SanDisk Technologies Inc.

U.S. Appl. No. 14/519,733, filed Oct. 21, 2014, SanDisk Technologies Inc.

\* cited by examiner

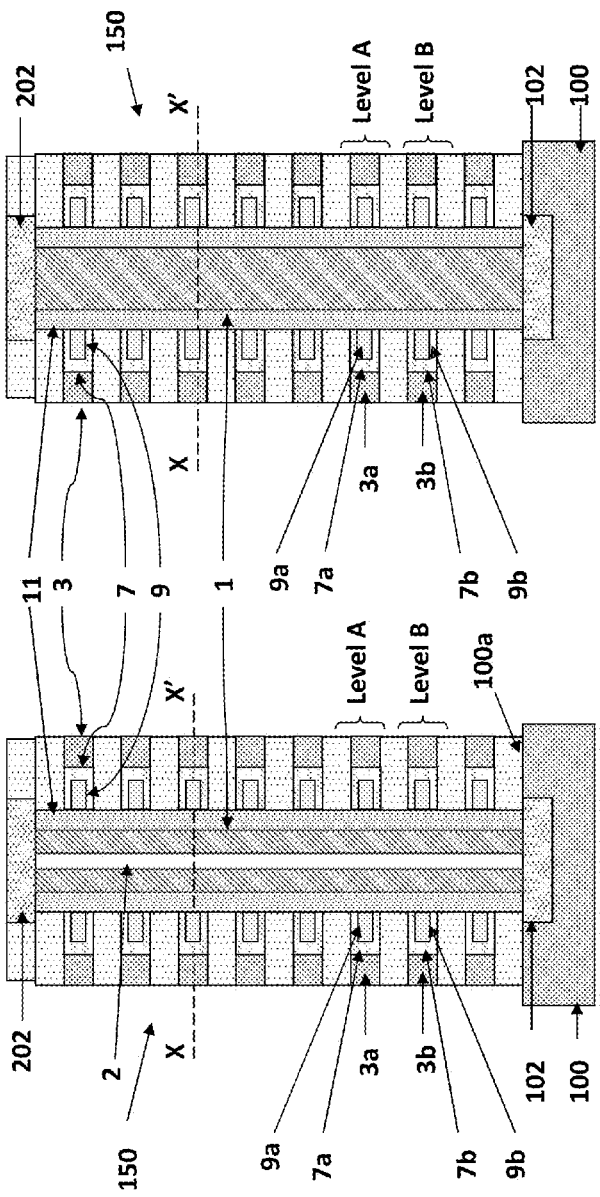

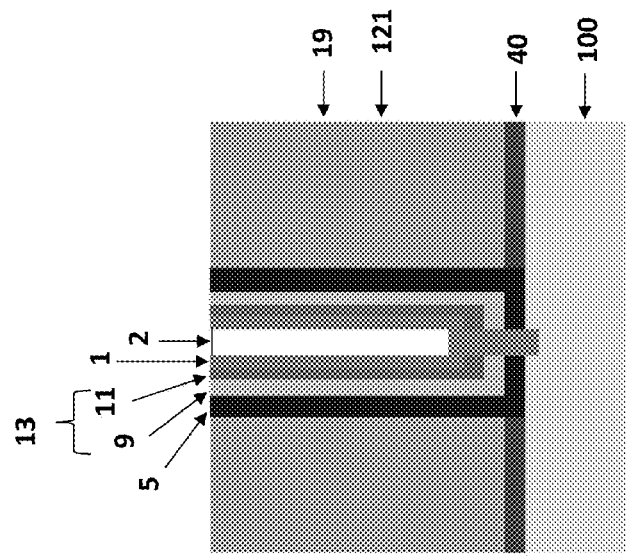
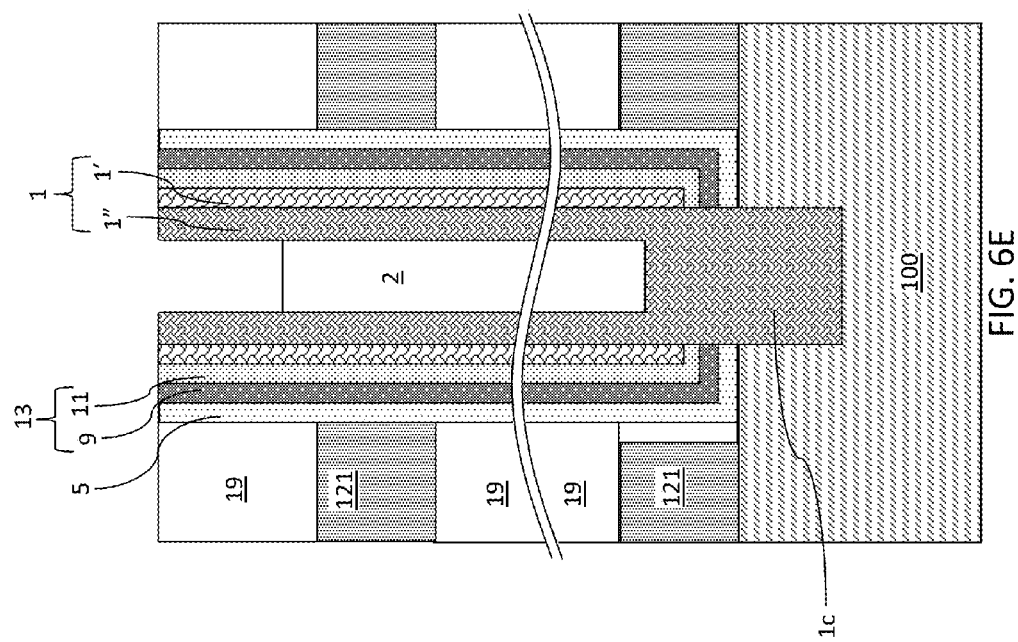

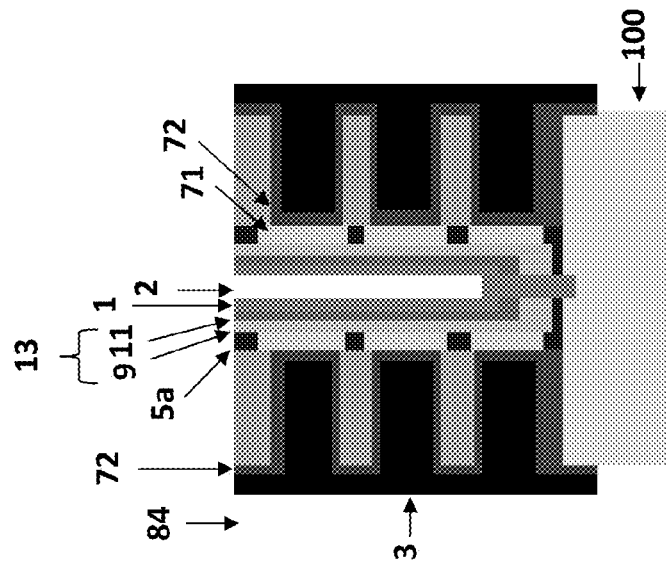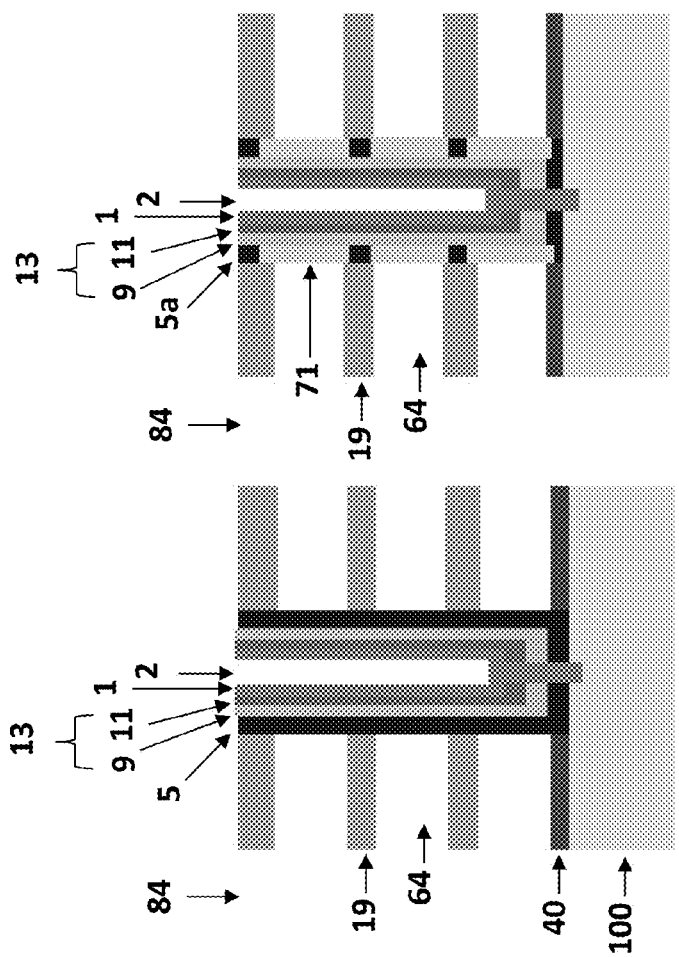

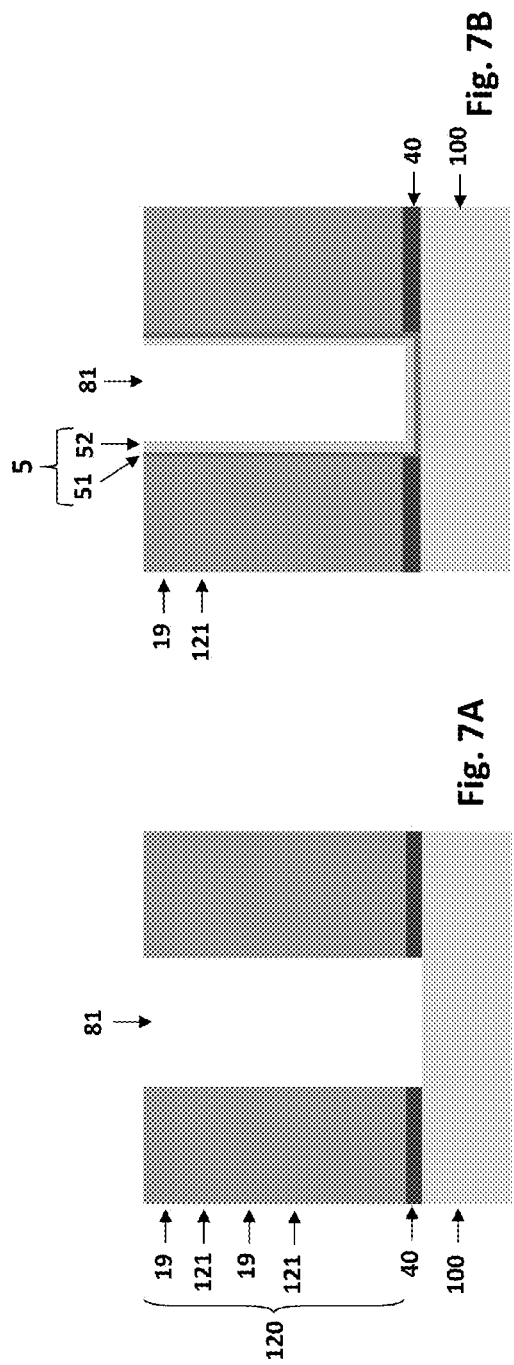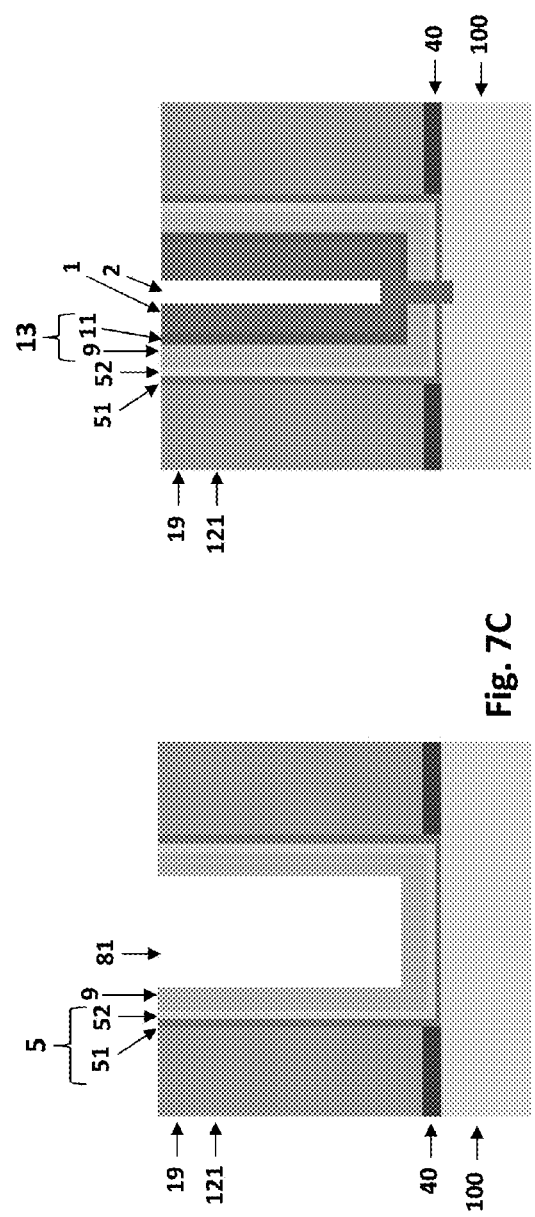

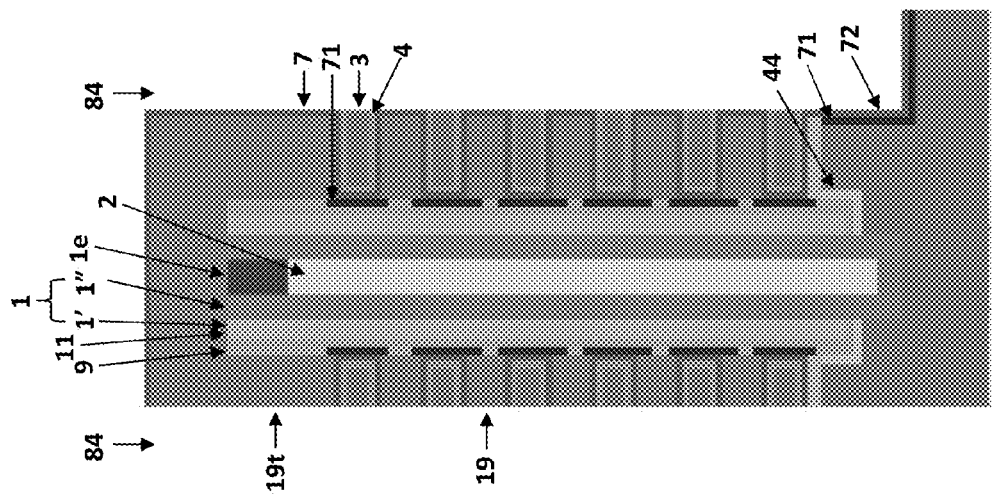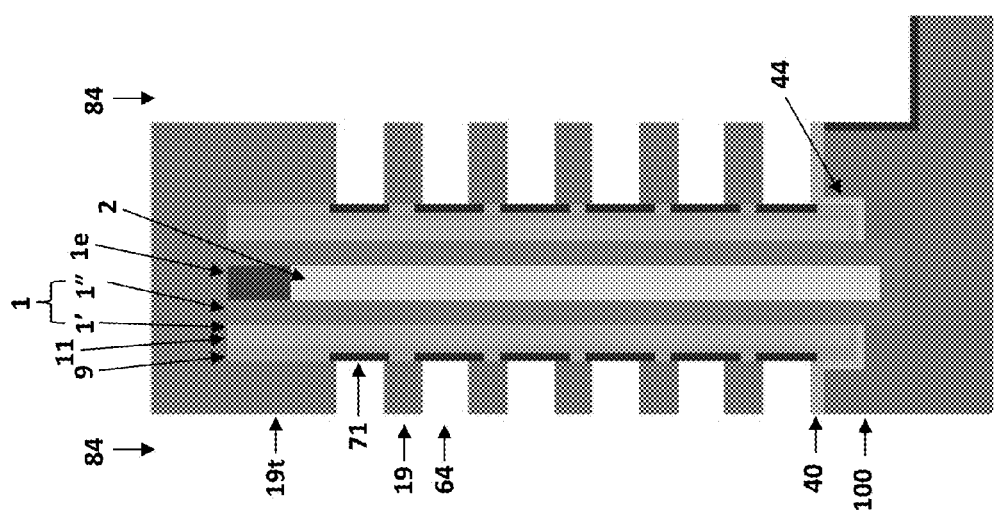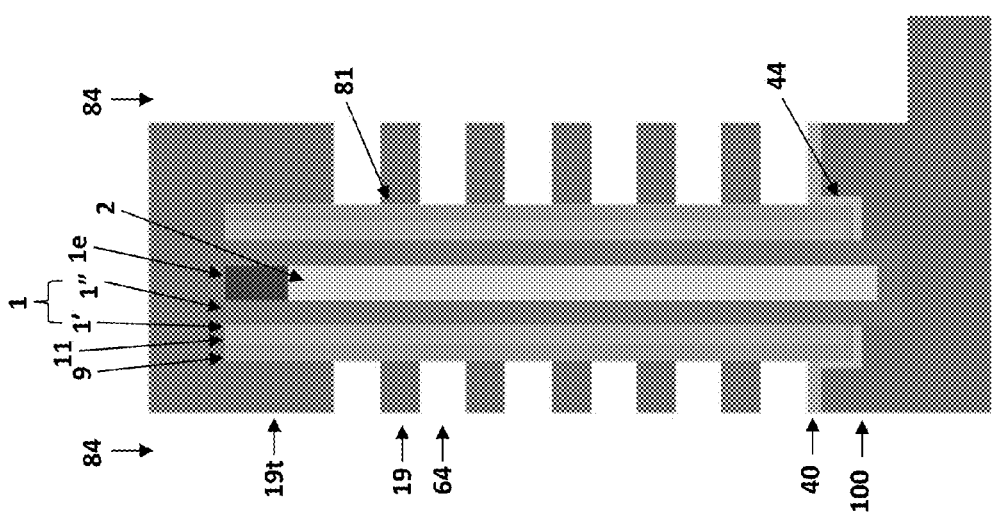

THREE DIMENSIONAL NAND DEVICE AND METHOD OF MAKING THEREOF

FIELD

The present disclosure relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

An embodiment relates to a method of making a monolithic three dimensional NAND string including forming a stack of alternating layers of a first material and a second material different from the first material over a substrate. The first material layers include a sacrificial material and the second material layers include an electrically insulating material. The method also includes forming at least one front side opening in the stack, forming an etch stop layer over a sidewall of the at least one front side opening, forming a memory film in the at least one front side opening and forming a semiconductor channel over the memory film in the at least one front side opening. The method also includes forming a back side opening in the stack and selectively removing the first material layers without removing the second material layers through the back side opening, thereby forming back side recesses between adjacent second material layers and exposing portions of the etch stop layer located in a back portion of the back side recesses. The method also includes oxidizing the exposed portions of the etch stop layer in the back side recesses to form oxidized portions of the etch stop layer, forming a blocking dielectric over a sidewall in the back side opening and over exposed surfaces of the second material layers and the oxidized portions of the etch stop layer in the back side recesses. The blocking dielectric has a clam-shaped portion in the back side recesses. The method also includes forming a plurality of control gate electrodes in which each of the plurality of control gate electrodes is located at least partially in an opening in a respective clam-shaped portion of the blocking dielectric.

Another embodiment relates to a monolithic three dimensional NAND string including a semiconductor channel, at least one end part of the semiconductor channel extending substantially perpendicular to a major surface of a substrate and a plurality of control gate electrodes extending substantially parallel to the major surface of the substrate. The plurality of control gate electrodes include at least a first control gate electrode located in a first device level and a second control gate electrode located in a second device level located over the major surface of the substrate and below the first device level. The first control gate electrode is separated from the second control gate electrode by an insulating layer located between the first and second control gate electrodes. The NAND string also includes a memory film located between the semiconductor channel and the plurality of control gate electrodes, and a blocking dielectric containing a plurality of clam-shaped portions each having two horizontal portions connected by a vertical portion. Each of the plurality of control gate electrodes is located at least partially in an opening in a respective clam-shaped portion of the blocking dielectric. The NAND string also includes a plurality of discrete cover silicon oxide segments located between the memory film and each respective a clam-shaped portion of the blocking dielectric containing a respective control gate electrode and a plurality of polysilicon segments separating respective cover silicon oxide segments in a direction perpendicular to the major surface of the substrate. Each of the plurality of polysilicon segments located between the memory film and the insulating layer located between the control gate electrodes.

Another embodiment relates to a monolithic three dimensional NAND string including a semiconductor channel, at least one end part of the semiconductor channel extending substantially perpendicular to a major surface of a substrate and a plurality of control gate electrodes extending substantially parallel to the major surface of the substrate. The plurality of control gate electrodes include at least a first control gate electrode located in a first device level and a second control gate electrode located in a second device level located over the major surface of the substrate and below the first device level. The first control gate electrode is separated from the second control gate electrode by an insulating layer located between the first and second control gate electrodes. The NAND string also includes a memory film located between the semiconductor channel and the plurality of control gate electrodes, and a blocking dielectric containing a plurality of clam-shaped portions each having two horizontal portions connected by a vertical portion. Each of the plurality of control gate electrodes is located at least partially in an opening in a respective clam-shaped portion of the blocking dielectric. The NAND string also includes a plurality of discrete cover silicon oxide segments located between the memory film and each respective a clam-shaped portion of the blocking dielectric containing a respective control gate electrode. Each of the plurality of cover silicon oxide segments have curved upper and lower sides and substantially straight vertical sidewalls.

BRIEF DESCRIPTION OF THE DRAWINGS

FIGS. 1A and 1B are respectively side cross sectional and top cross sectional views of a NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another NAND string. FIG. 2A is a side cross sectional view of the device along line Y-Y' in FIG. 2B, while FIG. 2B is a side cross sectional view of the device along line X-X' in FIG. 2A.

FIG. 4B is a side cross sectional view of the device along line B-B' in FIG. 4A, while FIG. 4C is a side cross sectional view of the device along line W-W' in FIG. 4A.

FIGS. 6A-6I are side cross sectional views of a portion of a NAND string according to an embodiment.

FIGS. 7A-7H are side cross sectional views of a portion of a NAND string according to an embodiment.

FIGS. 8A-8C are side cross sectional views of a portion of a NAND string according to an embodiment.

DETAILED DESCRIPTION

In many conventional three dimensional NAND string devices, the control gate electrodes are formed in recesses created after selectively removing sacrificial layers from a stack of alternating first and second material layers in which one of the first or second materials is a sacrificial material and the other material is an insulating material. The sidewalls of the recesses are then conformally coated with a cover oxide, forming a clam shaped cover oxide in the recesses. Next, the cover oxide is conformally coated with a blocking dielectric, forming a clam shaped blocking dielectric inside the clam shaped cover oxide in the recesses. After the blocking dielectric is formed, the control gate electrodes are formed inside the opening of the clam shaped blocking dielectric. The thickness of the conventional control gate electrode is approximately half the width of the original recesses formed on removing the sacrificial material. Half the thickness of the recesses is filled with the cover oxide in the blocking dielectric.

The inventors have realized that that is not necessary to have both the cover oxide and the blocking dielectric inside the recesses. The inventors have further realized that by removing the cover oxide from the recesses, the thickness of the control gates in each memory cell in the memory stack can be increased for a memory stack having the same height as the conventional memory stack. By increasing the thickness of the control gates, the resistance of the word lines may be reduced, such as by 40%, such as 35% relative to the word lines of the conventional devices. Alternatively, rather than increase the thickness of the control gates, a NAND string having a reduced stack height relative to the conventional NAND string may be fabricated with word lines having the same word line resistance as the conventional NAND strings.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
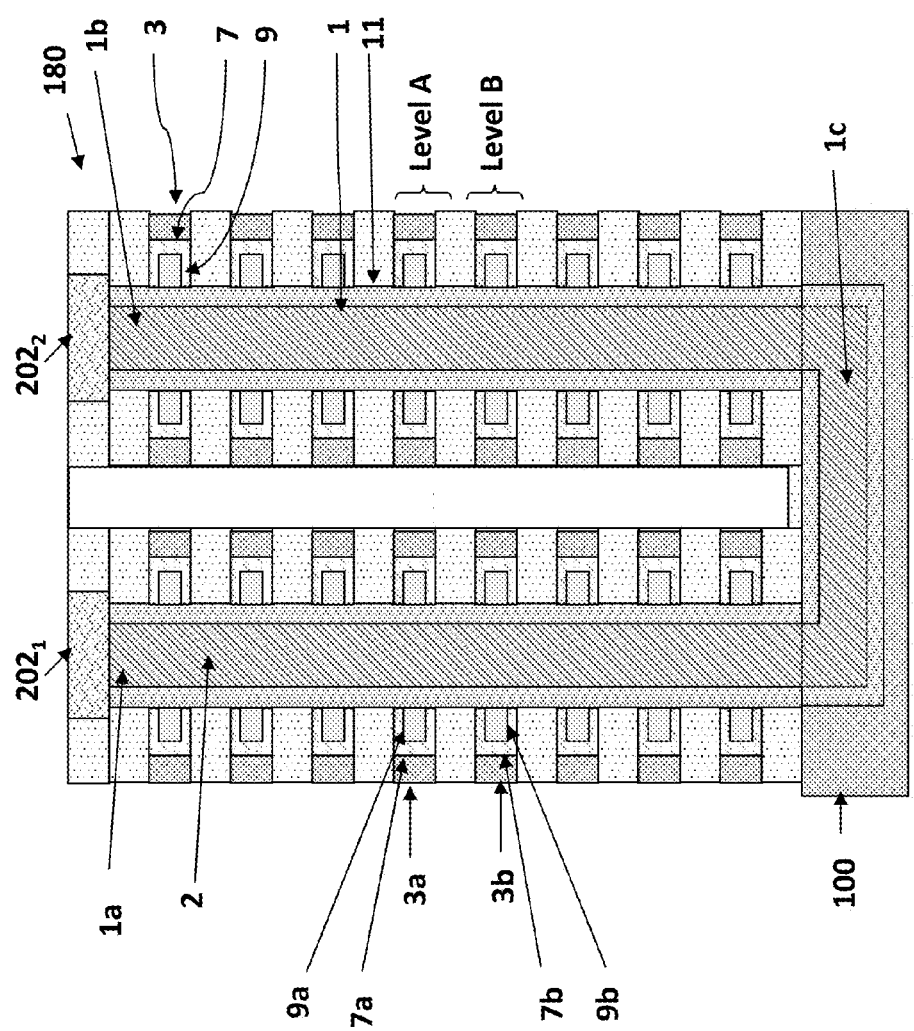
FIG. 3A is a side cross sectional view of a conventional NAND string with a U-shaped channel.
Figure 3B:
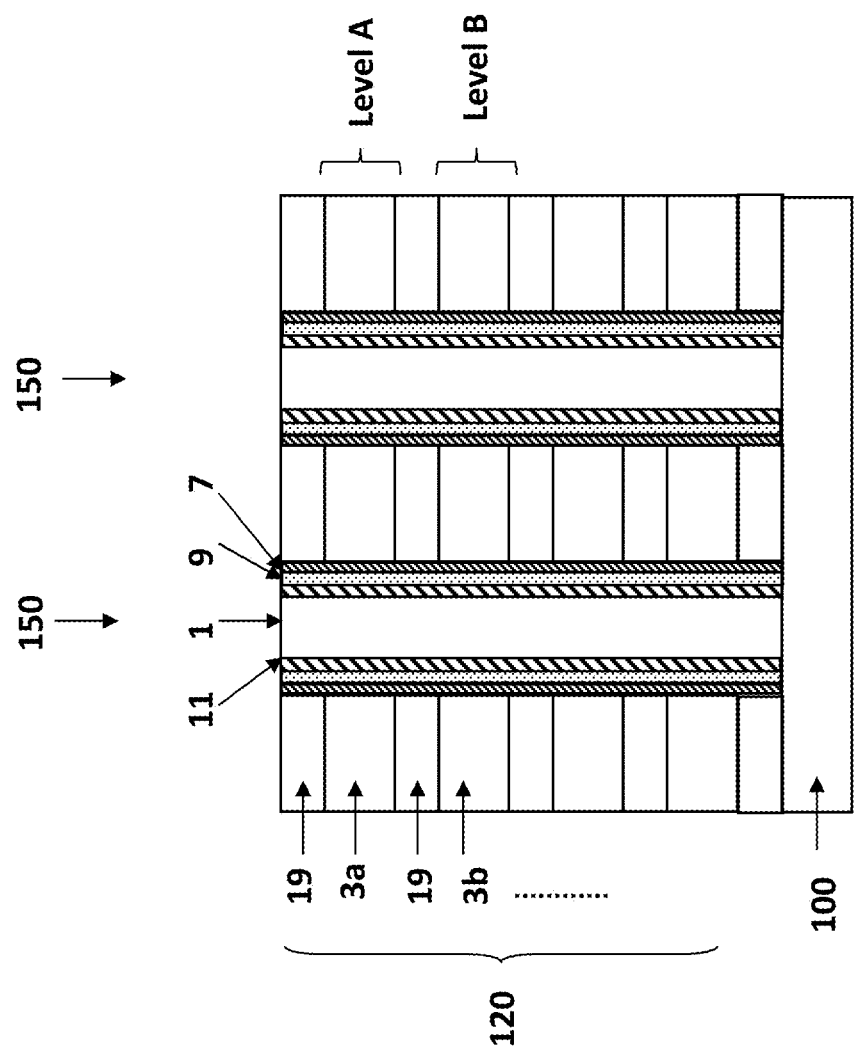
FIG. 3B is a side cross sectional view of another NAND string.

In some embodiments, the monolithic three dimensional NAND string 150 comprises a semiconductor channel 1 having at least one end portion extending substantially perpendicular to a major surface 100a of a substrate 100, as shown in FIGS. 1A, 2A, 3A, 3B, 4B and 4C. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Figures 5A, 5B:
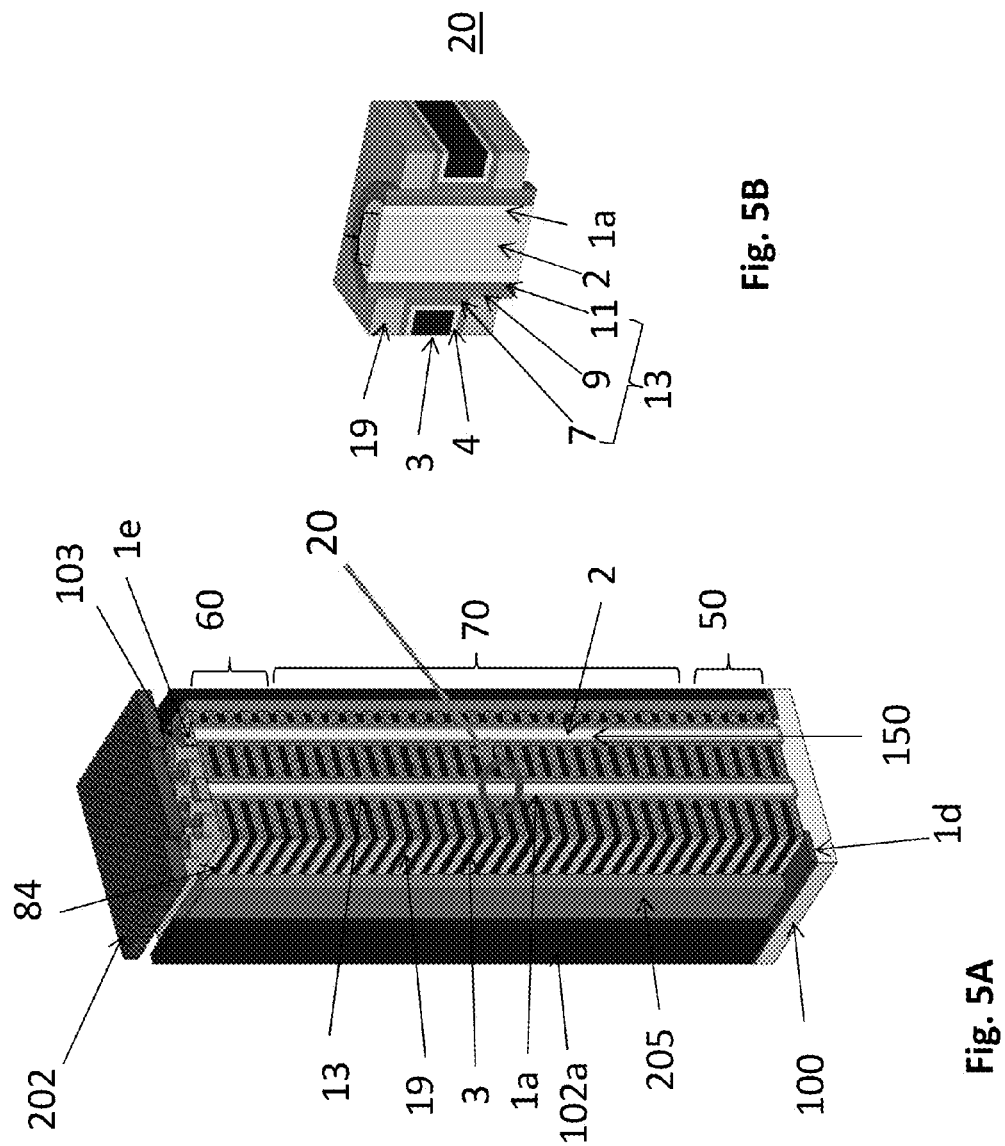
FIG. 5A is a cut-away, three dimensional perspective of the device of FIGS. 4A-4C, but with the optional lower semiconductor pillar omitted.
FIG. 5B is a close up, cross sectional view of one memory cell of FIG. 5A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. The NAND string's select or access transistors are not shown in FIGS. 1A-3B for clarity. However, the source side select transistor 50 and drain side select transistor 60 are shown in FIG. 5A. These transistors may have one select gate or plural select gates as shown in FIG. 5A.

In some embodiments, the semiconductor channel 1 may be a filled feature, as shown in FIGS. 2A and 2B. In some other embodiments, the semiconductor channel 1 may be hollow, for example a hollow cylinder filled with an insulating fill material 2 (e.g., core dielectric), as shown in FIGS. 1A-1B, 3B, 4B and 4C. In these embodiments, an insulating fill material 2 may be formed to fill the hollow part surrounded by the semiconductor channel 1.

Figure 4A:
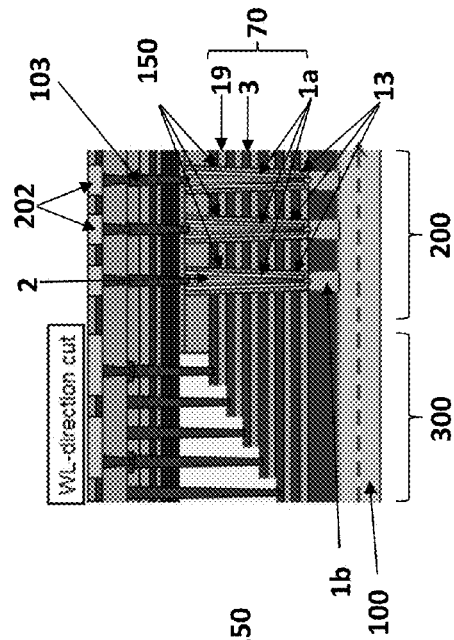
FIG. 4A is a top cross sectional view of a memory block of an embodiment of the invention.
Figure 4C:
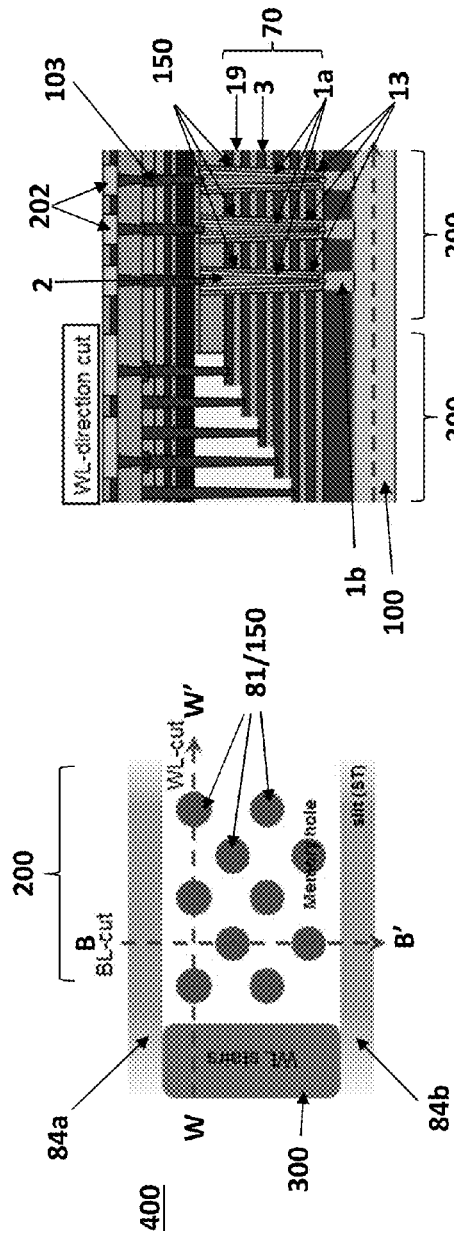
FIGS. 4B and 4C are side cross sectional views of the memory block of FIG. 4A along the bit line and word line directions, respectively.
Figure 4B:
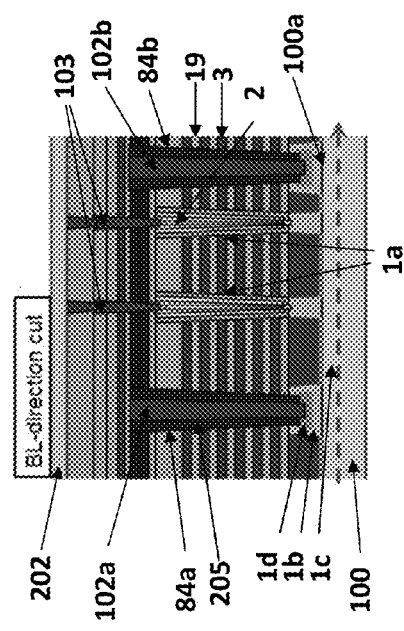

FIGS. 4A to 4C illustrate a memory block 400 containing an array of a plurality of vertical NAND strings 150 according to another embodiment of the invention. Each string includes the memory device levels 70, respectively, as shown in FIG. 4C. FIGS. 4A and 4C show the location of memory region 200 and the stepped word line contact region 300. FIG. 5A shows a three dimensional view of the device of FIGS. 4A-4C (with the silicon pillar 1b under the source 1d and the silicon pillar 1b under channel portion 1a omitted) and FIG. 5B shows a close up of one memory cell 20 of the device of FIG. 5A.

A first source electrode 102a is located in the first dielectric filled trench 84a and a second source electrode 102b is located in the second dielectric filled trench 84b in each block 400, as shown in FIGS. 4A, 4B and 5A. In the memory device levels 70, the dielectric fill in the trench 84 may comprise any suitable insulating layer 205, such as silicon oxide, etc., which is located on both walls of the trench 84. The source electrode 102 is located in the middle of the trench 84 and is separated from the control gate electrodes 3 by the insulating layer 205, as shown in FIGS. 4B and 5A. Drain electrodes (e.g., bit lines) 202 and drain lines 103 are located over the NAND memory cell region in memory device levels 70.

Each NAND string 150 contains a NAND memory cell region in the memory device levels 70 which includes the semiconductor channel 1 which contains a portion 1a which extends substantially perpendicular to the major surface 100a of the substrate 100. A bottom portion 1c of the channel 1 is located in or over the major surface 100a of the substrate 100, and extends toward the doped source region 1d substantially parallel to the major surface of the substrate. A drain region 1e is located in the upper part of the channel portion 1a in contact with a respective drain line 103, as shown in FIG. 5A. An optional semiconductor pillar may form an optional vertical portion 1b of the channel which extends substantially perpendicular to the major surface 100a of the substrate 100 and which contacts the source region 1d. The source region 1d may be located in the pillar above portion 1b of the channel or in the major surface 100a of the substrate.

The device contains a plurality of control gate electrodes 3 that extend substantially parallel to the major surface 100a of the substrate 100 in the memory device levels 70 from the memory region 200 to the stepped word line contact region 300. The portions of the control gate electrodes 3 which extend into region 300 may be referred to as "word lines" herein. The drain electrode (e.g., bit line) 202 electrically contacts an upper portion of the semiconductor channel 1 via drain lines 103.

Furthermore, each NAND string 150 contains at least one memory film 13 which is located adjacent to the semiconductor channel 1 (e.g., at least next to portion 1a of the channel) in the memory device levels 70, as shown in FIG. 4C. Specifically, the memory film 13 is located between the semiconductor channel 1 and the plurality of control gate electrodes 3. Each memory cell 20 includes a portion of the channel 1, a control gate electrode 3 and a portion of the memory film 13, as shown in FIGS. 5A and 5B. The memory film 13 contains the tunnel dielectric 11, the charge storage region(s) 9 (e.g., a charge trapping layer or floating gates), and the blocking dielectric 7, as shown in FIG. 5B. Each part of the memory film 13, such as the tunnel dielectric 11, the charge storage region 9, and/or the blocking layer 7 may be comprised of one or more layers (e.g., one or more dielectric layers) made of different materials.

As shown in FIG. 4C, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the block 400. In other words, the memory openings 81 do not completely sever the continuous electrical and physical path in the control gate electrodes from one trench 84 to the opposite trench 84 in each block.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A to 4C. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride, ruthenium or alloys thereof. For example, the control gate material in FIGS. 1A, 2A, 3A, 4B and 4C may comprise a conductive metal or metal alloy, such as tungsten and/or titanium nitride, while the control gate material in FIG. 3 may comprise doped polysilicon.

A blocking dielectric 7 is located adjacent to the control gate(s) 3 and may surround the control gate electrodes 3, as shown in FIGS. 1A, 2A and 3A. Alternatively, a straight blocking dielectric layer 7 may be located only adjacent to an edge (i e, minor surface) of each control gate electrode 3, as shown in FIG. 3B. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety. Alternatively, as discussed in more detail below with respect to FIGS. 6A-8C below, the blocking dielectric 7 may comprises a first blocking dielectric 71 comprising a straight, continuous layer or segment and a second blocking dielectric 72 that surrounds the control gates 3.

The monolithic three dimensional NAND string also comprise a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers) or high-k materials such as aluminum oxide, hafnium oxide or combinations thereof.

The charge storage region(s) 9 and the tunnel dielectric 11, and optionally the blocking dielectric 7, together are also referred to herein as a memory film 13, as shown in FIGS. 4B, 4C and 5B.

If desired, an optional barrier layer 4 may be located between the control gate electrode 3 and the blocking dielectric 7, as shown in FIG. 5B. The barrier layer 4 may comprise any suitable conductive barrier material, such as titanium nitride or tungsten nitride for tungsten control gate electrodes 3.

Figure 6B:
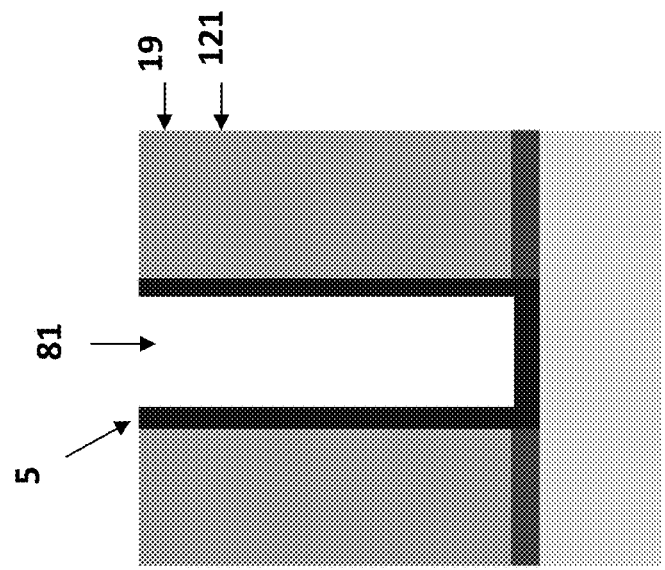
Figure 6A:
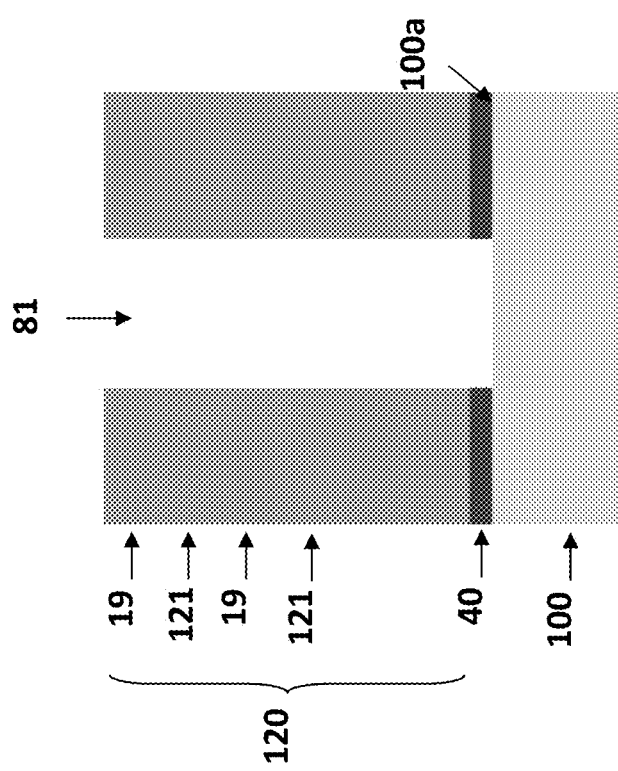

A first embodiment of making a NAND string 150 is illustrated in FIGS. 6A-6F. As illustrated in FIG. 6A, the method includes forming a stack 120 of alternating first material layers 121 and second material layers 19 over a major surface 100a of substrate 100. The stack 120 may be formed directly on the substrate 100 surface 100a. Alternatively, there may be intervening layers, such as an optional insulating etch stop layer 40, or devices located between the substrate 100 surface 100a and the stack 120. The second material is different from the first material. In an embodiment, the first material comprises a nitride, such as silicon nitride, or polysilicon, and the second material comprises an oxide, such as silicon oxide. Then, the stack 120 is etched to form at least one front side opening (memory hole) 81 in the stack 120. In an embodiment, forming the front side opening 81 comprises removing a portion of the insulating layer 40, thereby exposing a portion of the surface 100a of the substrate 100 in the front side opening 81.

Next, as illustrated in FIG. 6B, an etch stop layer 5 is formed over a sidewall of the at least one front side opening 81. The etch stop layer 5 may be formed from any suitable material. In an embodiment, the etch stop layer 5 is formed from a material that may be oxidized, such as undoped or doped polysilicon.

Figure 6C:
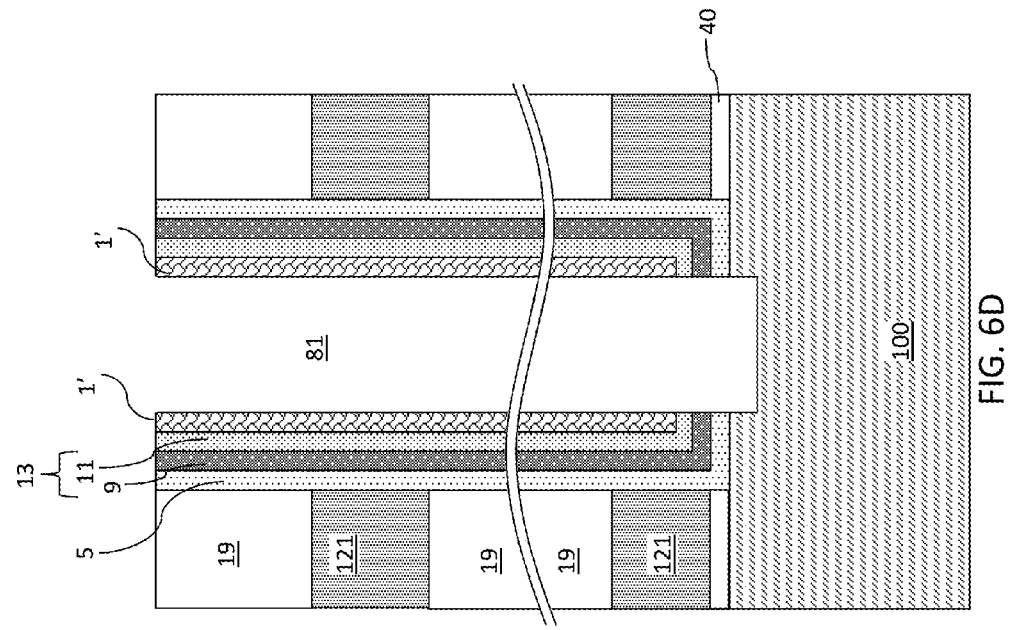

Then, as illustrated in FIG. 6C, a memory film 13 is formed over the etch stop layer 5 in the at least one opening 81. The memory film 13 comprises a charge storage material layer 9 and a tunnel dielectric 11. After forming the memory film 13, a semiconductor liner 1' is formed over the memory film 13 in the at least one opening 81. The semiconductor liner 1' protects the tunnel dielectric 11 during subsequent etching steps, discussed in more detail below, and forms a first portion of the semiconductor channel 1.

Figure 6D:
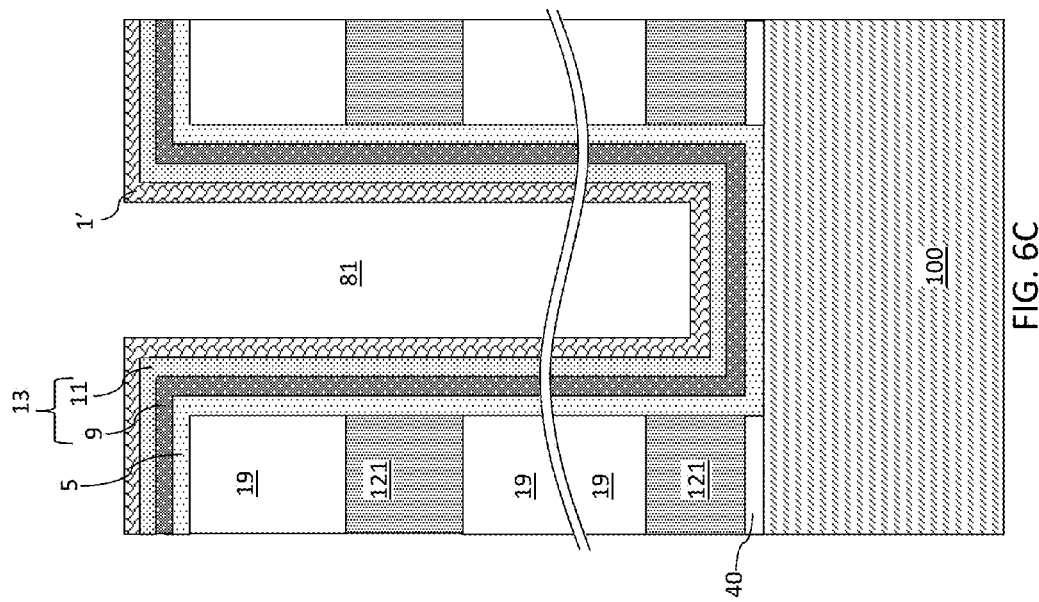

Next, as illustrated in FIG. 6D, the semiconductor liner 1', the tunneling dielectric 11, the charge storage material layer 9, and the etch stop layer 5 are sequentially anisotropically etched employing at least one anisotropic etch process. The portions of the semiconductor liner 1', the tunneling dielectric 11, the charge storage material layer 9, and the etch stop layer 5 located above the top surface of the stack 120 can be removed by the at least one anisotropic etch process. Further, the horizontal portions of the semiconductor liner 1', the tunneling dielectric 11, the charge storage material layer 9, and the etch stop layer 5 located at a bottom of the at least one opening can be removed to form openings in remaining portions thereof, thereby exposing the surface 100a of the substrate 100. If desired, the at least one opening 81 may be extended into the substrate 100, as illustrated in FIG. 6D.

Next, as illustrated in FIG. 6E, a second semiconductor layer (body layer) 1" is formed over the semiconductor liner 1'. If the at least one opening 81 is extended into the substrate 100, a semiconductor pillar 1c may be grown from the exposed surface of the substrate 100 to fill a bottom portion of the at least one opening 81. In an embodiment, the second semiconductor layer 1" is formed in the shape of a hollow cylinder. In an embodiment, the hollow cylinder may be filled with an insulating fill material 2. The insulating fill material 2 may be recessed and a doped drain region 1e may be formed in the recess in contact with the inert surface of the second semiconductor layer 1" (i.e., in contact with the channel of the NAND string).

FIG. 6F is simplified illustration of FIG. 6E with the drain region 1e omitted. As illustrated in FIG. 6F, the semiconductor channel 1 (which corresponds to 1a in FIGS. 4A-4C) may comprise the semiconductor liner 1', the second semiconductor layer 1" and the semiconductor pillar 1c. In an embodiment, the etch stop 5 layer comprises a polysilicon layer, the semiconductor liner 1' comprises polysilicon or amorphous silicon and the second semiconductor layer 1" comprises polysilicon or amorphous silicon.

Next, as illustrated in FIG. 6G, a back side opening 84, such as a trench, is formed in the stack 120 of first material layers 121 and second material layers 19. Then the first material layers 121 are selectively removed from the stack 120 through the back side opening 84 without removing the second material layers 19. The second material layers 122 may be selectively removed by selective etching (e.g., hot phosphoric acid etch of silicon nitride layers 121). This etching step results in the formation of back side recesses 64 located between adjacent second material layers 19. This step results in the etch stop layer 5 being exposed in the back side recesses 64.

Next, as illustrated in FIG. 6H, the exposed portions of the etch stop layers 5 in the back side recesses 64 are oxidized to form a plurality of cover oxide segments 71. The oxidation may comprise any suitable oxidation method, such as in-situ steam generation (ISSG), dry oxidation or wet oxidation. In an embodiment, the etch stop layer comprises polysilicon, the oxidized portions of the etch stop layer comprise silicon oxide and segments 71 extend through the entire thickness of the etch stop layer 5. In an embodiment, the cover oxide segments 71 are located adjacent to the charge storage layer 9. As illustrated in FIG. 6H, adjacent cover oxide segments 71 in each device level are separated from each other by unoxidized portions 5a of the etch stop layer 5. In an embodiment, each of the plurality of cover silicon oxide segments 71 has curved upper and lower sides and substantially straight vertical sidewalls.

Next, as illustrated in FIG. 6I, a blocking dielectric 72 is conformally formed over the sidewall of the cover oxide segments 71 located between the second material layers 19 and the exposed surfaces of the second materials layers 19 in the back side recesses 64. The blocking dielectric 72 has a clam shape inside the back side recesses 64.

As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open.

Control gate electrodes 3 are then formed over the blocking dielectric 72 inside the clam shaped blocking dielectric 72 via the back side opening 84. In an embodiment, the blocking dielectric 72 comprises $Al_2O_3$, and the control gate electrodes 3 comprise tungsten with a TiN or WN bather layer.

In an embodiment, oxidizing the exposed portions of the etch stop layer 5 forms a plurality of discrete cover silicon oxide segments 71 located between the memory film 13 and each respective a clam-shaped portion of the blocking dielectric 72 containing a respective control gate electrode 3. Oxidizing the exposed portions of the etch stop layer 5 also forms a plurality of polysilicon segments 5a separating respective silicon oxide segments 71 in a vertical direction perpendicular to the major surface 100a of the substrate 100. Each of the plurality of polysilicon segments 5a is located between the memory film 13 and the insulating layers 19 located between the control gate electrodes 3 in the horizontal direction parallel to the major surface 100a of the substrate 100.

FIGS. 7A-7D illustrate another embodiment of making a NAND string 150. As illustrated in FIG. 7A and similar to the embodiment illustrated in FIG. 6A, the method includes forming a stack 120 of alternating first material layers 121 and second material layers 19 over a major surface 100a of substrate 100. The stack 120 may be formed directly on the substrate 100 surface 100a. Alternatively, there may be intervening layers, such as an optional insulating etch stop layer 40, or devices located between the substrate 100 surface 100a and the stack 120. The second material is different from the first material. In an embodiment, the first material comprises a nitride, such as silicon nitride, and the second material comprises an oxide, such as silicon oxide. As in the previous embodiment, the stack 120 is etched to form at least one front side opening (memory hole) 81 in the stack 120.

Next, as illustrated in FIG. 7B, at least one etch stop layer 5 is formed in the at least one front side opening 81. As illustrated in FIG. 7B, the etch stop layer 5 may comprise more than one etch stop layer 5, such as a first etch stop layer 51 and a second etch stop layer 52. That is, the step of forming at least one etch stop layer 5 in the front side opening 81 may comprise forming a first oxide etch stop layer 51 by performing an in-situ steam generated (ISSG) oxidation of a sidewall of the at least one front side opening 81 and then forming a second oxide etch stop layer 52 (e.g., silicon oxide layer formed by CVD) over the first etch stop layer 51.

Then, as illustrated in FIG. 7C, a charge storage material layer 9 is formed over the etch stop layer 5 in the at least one front side opening 81. The charge storage material layer 9 may be made of any suitable material such as silicon nitride or may be a multilayer charge storage structure, such as a silicon oxide-silicon nitride-silicon oxide (ONO) structure.

Next, the NAND string is processed as illustrated in FIGS. 6C-6E illustrated above. First, a tunnel dielectric 11 is formed over the charge storage material layer 9 in the at least one front side opening 81 to form the memory film 13. After forming the memory film 13, a semiconductor liner 1' is formed over the memory film 13 in the at least one opening 81. The semiconductor liner 1' protects the tunnel dielectric 11 during subsequent etching steps, discussed in more detail above, and forms a first portion of the semiconductor channel 1.

Next, as illustrated in FIG. 6D above, the semiconductor liner 1', the tunneling dielectric 11, the charge storage material layer 9, and the etch stop layer 5 (or etch stop layers 5A, 5B if two etch stop layers are used) are sequentially anisotropically etched employing at least one anisotropic etch process. The portions of the semiconductor liner 1', the tunneling dielectric 11, the charge storage material layer 9, and the etch stop layer 5 located above the top surface of the stack 120 can be removed by the at least one anisotropic etch process. Further, the horizontal portions of the semiconductor liner 1', the tunneling dielectric 11, the charge storage material layer 9, and the etch stop layer 5 located at a bottom of the at least one opening can be removed to form openings in remaining portions thereof, thereby exposing the surface 100a of the substrate 100. If desired, the at least one opening 81 may be extended into the substrate 100, as illustrated in FIG. 6D.

Next, as illustrated in FIG. 6E and discussed above, a second semiconductor layer (body layer) 1" is formed over the semiconductor liner F. If the at least one opening 81 is extended into the substrate 100, a semiconductor pillar 1c may be grown from the exposed surface of the substrate 100 to fill a bottom portion of the at least one opening 81. In an embodiment, the second semiconductor layer 1" is formed in the shape of a hollow cylinder. In an embodiment, the hollow cylinder may be filled with an insulating fill material 2. FIG. 7D illustrates the results of performing the steps illustrated in FIGS. 6C-6E on the structure illustrated in FIG. 7C.

Figure 7E:
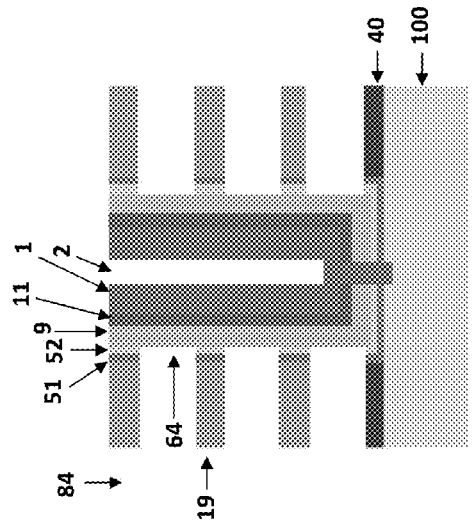

Then, as illustrated in FIG. 7E, a back side opening 84 may be formed in the stack 120. Further illustrated in FIG. 7E, the method includes selectively removing the first material layers 121 without removing the second material layers 19 through the back side opening 84, thereby forming back side recesses 64 between adjacent second material layers 19. The selective removal of the first material layers one and 21 results in exposure of the etch stop layer 5 in the back of the back side recesses 64. When the etch stop layer 5 comprises two etch stop layers 51, 52, the first etch stop layer 51 is exposed in the back of the back side recesses 64.

Figure 7F:
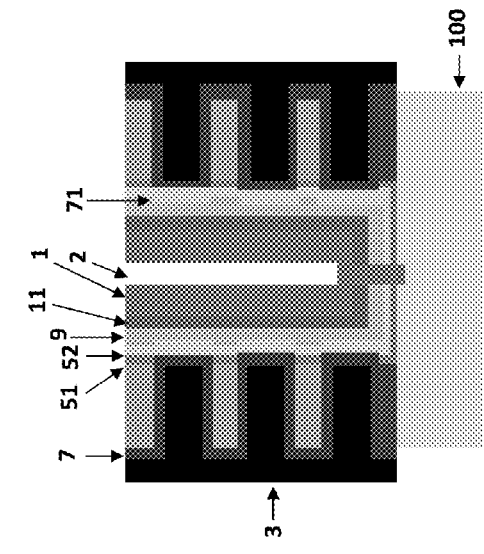

Next, as illustrated in FIG. 7F, the exposed portion of the etch stop layer 5 in the back of the back side recesses 64 are selectively removed to expose portions of the charge storage material layer 9 in the back side recesses 64. When the etch stop layer 5 comprises two etch stop layers 51, 52, both etch stop layers 51, 52 are removed by selective etching to expose portions of the charge storage material layer 9 in the back side recesses 64.

Figure 7G:
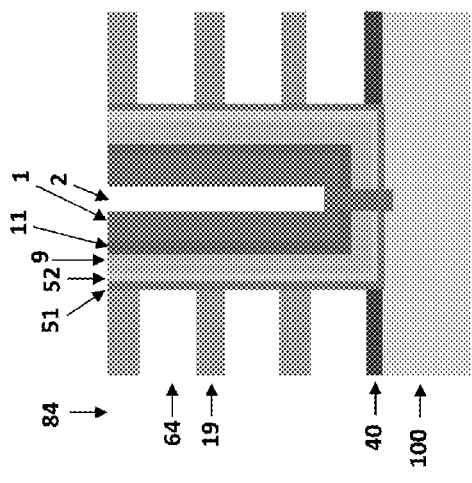

Then, as illustrated in FIG. 7G, portions of the charge storage material layer 9 exposed in the back side recesses 64 are selectively oxidized partially through a thickness of the charge storage material layer 9 to form cover oxide segments 71 in the charge storage material layer 9. Thus, the NAND string made according to this embodiment includes a plurality of discrete cover oxide segments 71 embedded in part of a thickness of the charge storage material layer 9 and located between the blocking dielectric 7 and the charge storage material layer 9. In an embodiment, a portion of the charge storage material layer 9 remains between each cover oxide segment 71 and the tunneling dielectric 11. In an embodiment, the charge storage layer 9 comprises a castellated layer having a variable thickness along a direction perpendicular to the major surface 100a of the substrate 100. Thicker portions of the charge storage material layer 9 separate respective cover oxide segments 71 in a direction perpendicular to the major surface 100a of the substrate 100.

In an embodiment, selectively oxidizing portions of the charge storage material layer 9 comprises performing an in-situ steam generated (ISSG) oxidation or steam low pressure radical oxidation in a batch furnace of an outer portion of a silicon nitride charge storage material layer 9. In an embodiment, each of the plurality of cover silicon oxide segments 71 comprise silicon oxide or silicon oxynitride, and have curved upper, lower and inner sides (facing the channel) and a substantially straight vertical sidewall facing the blocking dielectric 7. The segments 71 may have a thickness of about 3-5 nm when the silicon nitride charge storage material 9 has a thickness of about 6-10 nm Thus, the segments 71 may have a thickness of 35 to 65 percent of the initial thickness of the charge storage material 9.

Figure 7H:
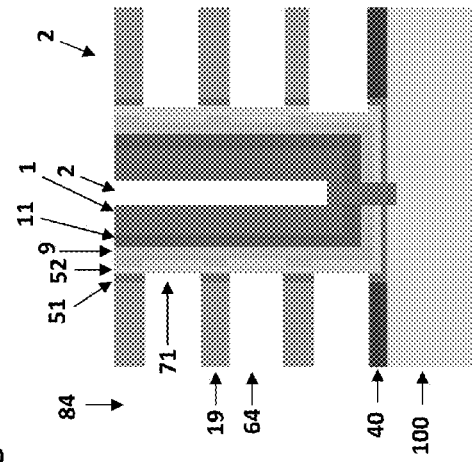

Next, as illustrated in FIG. 7H, the method includes forming a blocking dielectric 7 over a sidewall in the back side opening 84, over exposed surfaces of the second material layers 19 and over the cover oxide segments 71 in the back side recesses 64. The blocking dielectric 7 has a clam-shaped portion in the back side recesses 64. The method also includes forming a plurality of control gate electrodes 3. Each of the plurality of control gate electrodes is located at least partially in an opening in the respective clam-shaped portion of the blocking dielectric 7.

The monolithic three dimensional NAND string may further comprise a bather layer located between the control gate electrodes 3 and the blocking dielectric 7. Thus, in an embodiment, the method further comprises forming a bather layer over the blocking dielectric in the back side recesses prior to forming the control gate electrodes. The blocking dielectric comprises $Al_2O_3$, the control gate electrodes comprise tungsten and the barrier layer comprises TiN. In an embodiment, the discrete cover oxide segments 71 comprise silicon oxide or silicon oxynitride and the charge storage material layer 9 comprises silicon nitride. In an embodiment, the monolithic three dimensional NAND string comprises a plurality of etch stop layer segments (e.g., silicon oxide and/or oxynitride segments) located between the charge storage material layer 9 and the insulating layer 19 located between the control gate electrodes 3 in the horizontal direction parallel to the major surface of the substrate.

FIGS. 8A-8C illustrate another embodiment of the method and monolithic three dimensional NAND string made by the method.

This embodiment is similar to the previous embodiment. However, this embodiment does not include the formation of an etch stop layer 5 in the front side opening 81. FIG. 8A corresponds to FIG. 7E of the previous embodiment. As illustrated in FIG. 8A, the device includes at least one opening 81 (shown in filled in FIG. 8A and unfilled in FIG. 7E) in which a charge storage material layer 9, a tunnel dielectric 11, channel 1 (comprising a semiconductor liner 1' and a second semiconductor layer (body layer) 1"), and an optional insulating fill material 2. A top portion of the at least one opening 81 includes a doped polysilicon drain 1e in contact with layer 1". The top insulating layer 19t in the stack may be thicker than other layers 19 in the stack.

As illustrated in FIG. 8A, the first material layers 121 are selectively removed to from back side recesses 64 between the second material layers 19. In this embodiment, because of the lack of an etch stop layer 5 in the front side opening 81, portions of the charge storage material layer 9 are exposed when the first material layers 121 are selectively removed. Also illustrated in FIG. 8A is an insulating layer 44 (e.g., ISSG oxide) which may be formed in the front side opening prior to forming the charge storage material layer 9.

Next, as illustrated in FIG. 8B, portions of the charge storage material layer 9 exposed in the back side recesses 64 are selectively oxidized partially through a thickness of the charge storage material layer 9 to form cover oxide segments 71 in the charge storage material layer 9. Similar to the previous embodiment, NAND strings made according to this embodiment include a plurality of discrete cover oxide segments 71 embedded in part of a thickness of the charge storage material layer 9 and located between the blocking dielectric 7 and the charge storage material layer 9. In an embodiment, a portion of the charge storage material layer 9 remains between each cover oxide segment 71 and the tunneling dielectric 11. In an embodiment, the charge storage layer 9 comprises a castellated layer having a variable thickness along a direction perpendicular to the major surface 100a of the substrate 100. Thicker portions of the charge storage material layer 9 separate respective cover oxide segments 71 in a direction perpendicular to the major surface 100a of the substrate 100.

Then, as illustrated in FIG. 8C, the method includes forming a blocking dielectric 7 over a sidewall in the back side opening 84, over exposed surfaces of the second material layers 19 and over the cover oxide segments 71 in the back side recesses 64. The blocking dielectric 7 has a clam-shaped portion in the back side recesses 64. The method also includes forming a plurality of control gate electrodes 3. Each of the plurality of control gate electrodes is located at least partially in an opening in the respective clam-shaped portion of the blocking dielectric 7. The monolithic three dimensional NAND string further comprises a barrier layer 4 located between the control gate electrodes 3 and the blocking dielectric 7. The barrier layer 4 may comprise any suitable material, such as TiN or WN.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:
    forming a stack of alternating layers of a first material and a second material different from the first material over a substrate, the first material layers comprising a sacrificial material and the second material layers comprising an electrically insulating material;
    forming at least one front side opening in the stack;
    forming an etch stop layer comprising polysilicon over a sidewall of the at least one front side opening;
    forming a memory film comprising a different material than the etch stop layer in the at least one front side opening;
    forming a semiconductor channel over the memory film in the at least one front side opening;
    forming a back side opening in the stack;
    selectively removing the first material layers without removing the second material layers through the back side opening, thereby forming back side recesses between adjacent second material layers and exposing portions of the etch stop layer located in a back portion of the back side recesses;
    converting the etch stop layer into a vertically alternating stack of silicon oxide segments and polysilicon segments by oxidizing the exposed portions of the etch stop layer in the back side recesses while the memory material layer remains unchanged, wherein the etch stop layer is a single contiguous layer extending along the sidewall of the at least one front side opening prior to conversion, wherein each silicon oxide segment is an oxidized portion of the etch stop layer after the conversion, and each polysilicon segment is an unoxidized remaining portion of the etch stop layer after the conversion;

forming a blocking dielectric over a sidewall in the back side opening and over exposed surfaces of the second material layers and the silicon oxide segments, the blocking dielectric having a clam-shaped portion in the back side recesses; and forming a plurality of control gate electrodes, each of the plurality of control gate electrodes is located at least partially in an opening in a respective clam-shaped portion of the blocking dielectric.

2. The method of claim 1, wherein forming the memory film comprises:

forming a charge storage material layer over the etch stop layer in the at least one front side opening; and forming a tunnel dielectric over the charge storage material layer in the at least one front side opening.

3. The method of claim 1, wherein the blocking dielectric comprises $Al_2O_3$, and the control gate electrodes comprise tungsten.

4. The method of claim 1, wherein the semiconductor channel comprises a hollow cylinder and further comprising filling the hollow cylinder with an insulating fill material.

5. The method of claim 1, further comprising forming an insulating layer on the substrate prior to forming the stack of first and second material layers.

6. The method of claim 5, wherein forming at least one front side opening comprising removing a portion of the insulating layer, thereby exposing a portion of the surface of the substrate in the memory hole.

7. The method of claim 1, further comprising:
forming a semiconductor liner over the memory film;
etching bottom portions of the semiconductor liner and the memory film to expose a portion of the substrate in the front side opening; and
forming the semiconductor channel over the semiconductor liner in contact with the exposed portion of the substrate in the front side opening.

8. The method of claim 7, wherein:
the semiconductor liner comprises polysilicon or amorphous silicon; and
the semiconductor channel comprises polysilicon or amorphous silicon.

9. The method of claim 8, wherein the first material layers comprise silicon nitride and the second material layers comprise silicon oxide.

10. The method of claim 8, wherein
each silicon oxide segment is located between the memory film and the blocking dielectric; and
each of the polysilicon segments is located between the memory film and the insulating layer located between the control gate electrodes.

11. The method of claim 1, wherein:
the substrate comprises a silicon substrate;
the monolithic three dimensional NAND string is located in an array of monolithic three dimensional NAND strings over the silicon substrate;
at least one memory cell in a first device level of the three dimensional array of NAND strings is located over another memory cell in a second device level of the three dimensional array of NAND strings; and
the silicon substrate contains an integrated circuit comprising a driver circuit for the memory device located thereon.

* * * * *